United States Patent [19]

Henderson et al.

[11] Patent Number: 5,469,324

[45] Date of Patent: Nov. 21, 1995

[54] INTEGRATED DECOUPLING CAPACITIVE CORE FOR A PRINTED CIRCUIT BOARD AND METHOD OF MAKING SAME

[75] Inventors: Watson R. Henderson, Broomfield; Floyd G. Paurus, Boulder; Stanley R. Szerlip, Longmont, all of Colo.

[73] Assignee: Storage Technology Corporation, Louisville, Colo.

[21] Appl. No.: 319,651

[22] Filed: Oct. 7, 1994

[51] Int. Cl.[6] ................................................ H01G 4/018
[52] U.S. Cl. .................... 361/301.2; 361/762; 361/763; 361/311; 29/25.42
[58] Field of Search ........................ 361/301.2, 301.4, 361/320, 321.1, 321.2, 315, 750, 762, 763, 314, 313, 315, 311; 174/259, 255; 29/25.42

[56] References Cited

U.S. PATENT DOCUMENTS

| | | | |
|---|---|---|---|
| 4,295,183 | 10/1981 | Miersch et al. | 361/403 |
| 4,682,414 | 7/1987 | Butt | 29/840 |
| 4,755,911 | 7/1988 | Suzuki | 174/259 |
| 5,010,641 | 4/1991 | Sisler | 29/830 |
| 5,162,977 | 11/1992 | Paurus et al. | 361/401 |

Primary Examiner—Kristine L. Kincaid
Assistant Examiner—Michael D. Switzer
Attorney, Agent, or Firm—Sterne, Kessler, Goldstein & Fox

[57] ABSTRACT

A printed circuit board includes a planar first outer layer, a planar second outer layer, and a planar capacitive power distribution core disposed between the first and second outer layers. The capacitive core is formed from first and second electrically conductive layers with a dielectric layer disposed therebetween. The dielectric layer is made from a high dielectric constant material such as a ceramic in the form of a perforated sheet. The perforations permit the electrically conductive layers to be bound to the dielectric layer without significantly increasing the separation between the conductive layers. Each perforation allows a column of adhesive to collect therein to bond the power distribution core together. The resulting capacitance is typically sufficient to eliminate the need for decoupling capacitors.

13 Claims, 1 Drawing Sheet

INTEGRATED DECOUPLING CAPACITIVE CORE FOR A PRINTED CIRCUIT BOARD AND METHOD OF MAKING SAME

BACKGROUND OF THE INVENTION

1. Field of the Invention

This invention relates generally to electronic printed circuit boards, and more specifically, to a printed circuit board having an embedded high capacitance core used as a decoupling capacitor for integrated circuits installed on the printed circuit board.

2. Related Art

Typical printed circuit boards consist of multiple layers of composites of organic and inorganic materials, with internal and external wiring, allowing electrical components to be mechanically supported and electrically connected. The technology trend in printed circuit board manufacturing has been towards increasing numbers of interconnect layers, greater pass-through hole densities (permitted by smaller hole diameters), and finer trace widths. The goal of this trend is to allow greater numbers of components to be installed on a printed circuit board of a given size. Throughout this evolution in printed circuit board technology, however, little progress has been made with respect to building active or passive electronic devices as integrated elements during the multi-layer printed circuit board manufacturing process. This lack of progress is due primarily to the incompatibility of printed circuit board manufacturing processes and component manufacturing processes. Few process similarities exist.

In a typical multi-layered printed circuit (PC) board, a plurality of layers or planar, copper foil-clad fiberglass elements are laminated together, with certain of the copper surfaces having been previously etched to provide the desired signal paths between externally mounted components. Power is typically supplied to the externally mounted components, such as integrated circuits, via a power distribution core consisting of a fiberglass/epoxy dielectric element sandwiched between a copper foil power plane and a similar ground plane.

The dielectric constant of the fiberglass/epoxy dielectric typically ranges from approximately 4.0 to 5.5. Such a low dielectric constant provides a capacitance of approximately 200 picoFarads per square inch. This capacitance is not sufficient to satisfy the inrush (instantaneous) current requirements of a typical integrated circuit. Therefore, a fiberglass/epoxy power core necessitates that additional, externally mourned decoupling capacitors be used on the printed circuit board.

For a typical printed circuit board assembly having a large number of integrated circuits, a correspondingly large number of decoupling capacitors is typically required. Such capacitors occupy considerable printed circuit board surface area, require extra assembly (insertion) time, and increase the overall cost of a completed primed circuit board unit. In addition to the per capacitor cost, each capacitor also constitutes a potential point of failure that reduces system reliability.

Commonly owned U.S. Pat. No. 5,162,977 to Paurus et al. discloses a printed circuit board which includes a high capacitance power distribution core. The high capacitance core consists of a ground plane and a power plane separated by a dielectric element having a high dielectric constant. The dielectric element is typically glass fiber impregnated with a binding/bonding material, such as an epoxy resin loaded with a high dielectric constant, fired ceramic substance. The ceramic substance is in the form of a nanopowder. The resulting capacitance of the power distribution core is typically sufficient to eliminate, or significantly reduce, the need for decoupling capacitors.

Conventional glass fibers used in power cores have a dielectric constant of approximately 6.0. Conventional epoxy resins have a dielectric constant of approximately 4.0. The dielectric constant of the resulting combined glass fiber/epoxy resin core is in the range of 4.2 to 4.6. In the '977 patent disclosure, two materials having widely differing dielectric properties are combined (i.e., a high dielectric constant binder and a relatively low dielectric constant fiberglass mat). The resultant effective dielectric constant of the combination varies considerably with the ratio of the two materials.

Commonly owned, copending U.S. patent application No. 08/175,048, filed Dec. 29, 1993, is directed to improving upon the teachings of the '977 patent by providing a dielectric element in which both the fiber mat and the binder have a high dielectric constant. Thus, a high dielectric composite material is formed. The present invention is directed toward improving further on the teachings of the '977 patent to provide a high capacitance power distribution core which is inexpensive and straightforward to manufacture.

SUMMARY OF THE INVENTION

The invention is a printed circuit board having a planar first outer layer, a planar second outer layer, and a planar capacitive power distribution core disposed between the first and second outer layers. The outer layers of the printed circuit board are formed from standard foil-clad fiberglass plate. The capacitive core is formed from first and second electrically conductive layers with a dielectric layer disposed therebetween. The dielectric layer is made from a high dielectric constant material such as a ceramic in the form of a perforated sheet. The perforations permit the electrically conductive layers to be bound to the dielectric layer without significantly increasing the separation between the conductive layers. The resulting capacitance is typically sufficient to eliminate the need for decoupling capacitors.

The capacitive power distribution core is formed according to the following method. First, the dielectric material is formed into a perforated sheet. Next, an adhesive (such as an epoxy) is applied to one or more of the mating surfaces of the electrically conductive layers and/or the perforated sheet. In the preferred embodiment, the adhesive is applied to a surface of the perforated sheet to fill the perforations therein. The excess adhesive is then squeegeed from the surface of the perforated sheet.

The perforated sheet is sandwiched between the two electrically conductive layers to form the power distribution layer. Suitable pressure (the amount of pressure required will depend, among other things, on the viscosity of the adhesive) is applied to the core to force the adhesive between the perforated sheet and the first electrically conductive layer and between the perforated sheet and the second electrically conductive layer to flow into the perforations in the perforated sheet. Any adhesive which remains between the dielectric layer (perforated sheet) and one of the conductive layers should have a thickness small enough to not appreciably reduce capacitance. Finally, the adhesive is then cured while under pressure to bind the capacitive core together.

In the preferred embodiment, each perforation in the dielectric sheet has a diameter or size small enough to assure that the conductive sheets will not contact each other through one of the perforations. For example, the diameter of each perforation may be less than two or three times the thickness of the dielectric sheet. The perforations are evenly spaced over and cover preferably at least one-half of the surface area of the dielectric sheet. Such spacing and coverage assures adequate bonding of the capacitive core.

Once the capacitive power distribution core of the invention is assembled, a desired number of pre-etched, foil-clad, FR-4 epoxy filled prepregnated panels may be laminated to one or both sides of the power distribution core to complete the printed circuit board.

The foregoing and other features and advantages of the invention will be apparent from the following, more particular description of a preferred embodiment of the invention, as illustrated in the accompanying drawings.

DETAILED DESCRIPTION OF THE PREFERRED EMBODIMENTS

The preferred embodiments of the invention are discussed in detail below. While specific part numbers and configurations are discussed, it should be understood that this is done for illustration purposes only. A person skilled in the relevant art will recognize that other components and configurations may be used without parting from the spirit and scope of the invention.

The preferred embodiments of the invention are now described with reference to the figures where like reference numbers indicate like elements. Also in the figures, the left-most digit of a reference number indicates the figure in which the number first appears.

Figure 1:
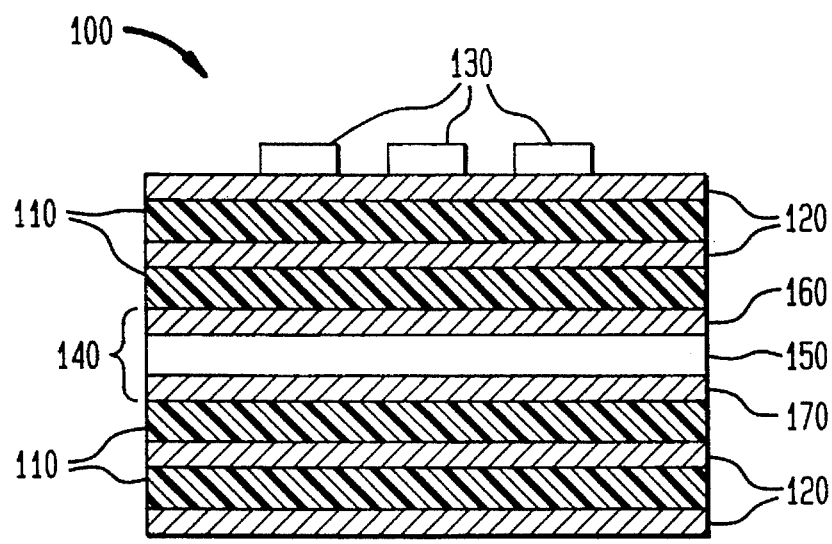
FIG. 1 is a cross-section illustrating a high capacitance core printed circuit board in accordance with the present invention.

FIG. 1 shows a high capacitance core, multi-layer printed circuit (PC) board 100 in accordance with the present invention. PC board 100 includes a plurality of layers of copper foil-clad 120 fiberglass plates or panels 110. A plurality of electronic components (e.g., integrated circuit chips) 130 are mounted on a surface of PC board 100. The present invention substitutes, for the typical fiberglass/epoxy dielectric power distribution core, a high capacitance power distribution core 140 having a capacitance at least an order of magnitude greater than that of a typical fiberglass/epoxy composition. Core 140 includes a dielectric layer 150 sandwiched between a first (e.g., upper) conductive layer 160 and a second (e.g., lower) conductive layer 170.

Power is supplied to the externally mounted components 130 via power distribution core 140. For example, conductive layer 160 may be used as a power plane, and conductive layer 170 may be used as a ground plane. Due to its high-capacitance per unit area, the present invention eliminates the need for decoupling capacitors externally mounted on PC board 100.

Figure 2:
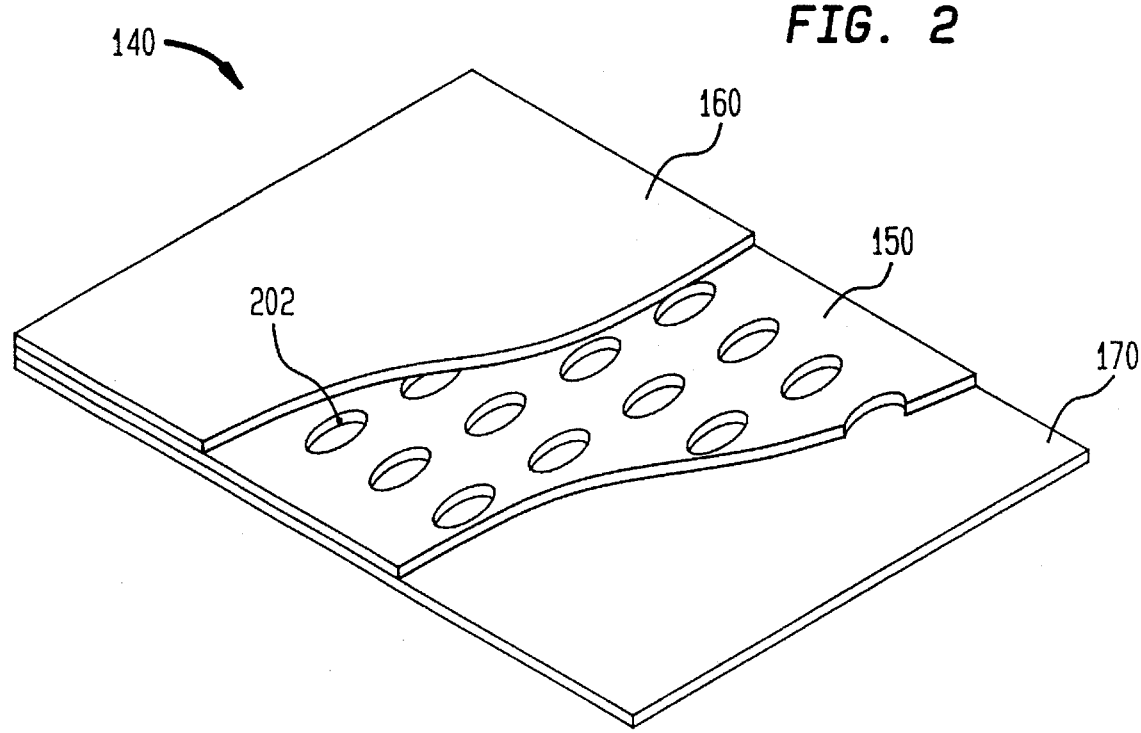
FIG. 2 is a cutaway perspective view showing the high capacitance power core of the invention.

The preferred embodiment of power distribution core 140 is shown in greater detail in FIG. 2. As discussed above, power distribution core 140 includes dielectric layer 150 sandwiched between first conductive layer 160 and second conductive layer 170. In the preferred embodiment, first and second conductive layers 160,170 are formed from copper foil. Dielectric layer 150 is formed from a high dielectric constant material such as a ceramic. The dielectric constant of the high dielectric constant material is greater than 1000 and is commonly in the range of 10,000 to 25,000.

The high dielectric constant material may be a variety of known ferroelectric, paraelectric and antiferroelectric materials. These include, but are not limited to, lead zirconate titanate (PZT). PZT is a solid solution of lead zirconate ($PbZrO_3$) and lead titanate ($PbTiO_3$). Additional suitable high dielectric constant ferroelectric materials are those having a Curie temperature $T_c$ somewhat above the operating temperature of the printed circuit board (e.g., $T_c$=50° to 100° degrees C.).

The class of materials called perovskites (which includes PZT) are further examples of ferroelectric materials. Another perovskite having a suitably high dielectric constant includes, but is not limited to, barium titanate. Moreover, PZT or barium titanate may be used in combination with calcium, bismuth, iron, lanthanum or strontium additives. Other alternative ferroelectric materials include materials with a tungsten-bronze crystal structure, including, but not limited to, lead metaniobate ($PbNb_2O_3$), lead metatantalate ($PbTa_2O_3$), sodium barium niobate ($NaBa_2Nb_5O_{15}$), as well as the preceding five tantalate/niobate compounds with bismuth, lanthanum, or strontium additives.

Certain paraelectric materials may also be suitable for dielectric layer 150. A paraelectric material is one which exhibits a high dielectric constant range at temperatures somewhat above its Curie temperature. Suitable paraelectric materials would be those materials having Curie temperatures somewhat below the printed circuit board operating temperature (e.g., $T_c$=−70° to 0° degrees C.). Certain antiferroelectric materials may also be suitable for dielectric layer 150.

Selection of ferroelectric, paraelectric or antiferroelectric materials having suitably high dielectric constants will be apparent to a person skilled in the relevant art.

In the preferred embodiment, dielectric layer 150 is formed into a sheet having a thickness on the order of 3.0 mils thick. Assuming a high dielectric constant material, e.g., $Pb(Mg_xNb_{1-x})O_3$, having a dielectric constant of 25,000, such a dielectric layer would result in a power core exhibiting a capacitance on the order of 1.9 microFarads per square inch. This capacitance is a substantial increase over known power cores.

In order to take advantage of this high dielectric layer, separation between conductive layers 160,170 and dielectric layer 150 must be minimized. Adhesive layers used to bond conductive layers 160,170 and dielectric layer 150 must be on the order of micro inches thick or the increase in separation between conductive layers 160,170 will substantially reduce the capacitance of power distribution core 140. For example, with a dielectric layer having a thickness of 3 mils and a dielectric constant of 1000, two adhesive layers (having a dielectric constant in the range of 4) of 6 microinches each will cause a reduction in capacitance of approximately 50%. Moreover, it would be difficult to realize a very thin layer of adhesive which could provide the required bonding strength.

An alternate bonding scheme is used in the manufacture of metallized ceramic capacitors. In that method, the conductive metal layers are added to the ceramic dielectric prior to sintering or firing of the ceramic. The metal layers and ceramic dielectric are then fired to bond the layers together. This method, however, is not suitable for use with the materials commonly used in primed circuit board fabrication. For example, conductive layers 160,170 are commonly made from copper foil. Copper is not suited for the very high temperatures required to sinter ceramic materials.

The inventors have discovered a cost-efficient and straightforward means by which a dielectric layer, such as a ceramic, can be bonded to conductive metal layers while minimizing separation between the conductive layers.

Dielectric layer 150 is formed as a perforated sheet. As illustrated in FIG. 2, a plurality of perforations or holes 202 are evenly spaced over dielectric layer 150. Perforations 202 allow conductive layers 160,170 to be 10 bonded together through dielectric layer 150 without an excessive increase in the separation between conductive layers 160,170. Each perforation 202 allows a column of adhesive to collect therein to bond power distribution core 140 together.

In the preferred embodiment, power distribution core 140 is formed according to the following method. First, the dielectric material is formed into a perforated sheet. Next, an adhesive (such as an epoxy) is applied to one or more of the mating surfaces of the electrically conductive layers and/or the perforated sheet. In the preferred embodiment, the adhesive is applied to a surface of the perforated sheet to fill the perforations therein. The excess adhesive is then squeegeed from the surface of the perforated sheet.

The perforated sheet is then sandwiched between the two electrically conductive layers to form power distribution 140. Suitable pressure is applied to core 140 to force the adhesive between the perforated sheet and the first electrically conductive layer and between the perforated sheet and the second electrically conductive layer to flow into the perforations in the perforated sheet. Any adhesive which remains between dielectric layer 150 and one of conductive layers 160,170 should have a thickness small enough to not appreciably reduce capacitance. Finally, the adhesive is cured with sufficient pressure on the core as required to preserve intimate contact between layers 150, 160 and 170.

Each perforation 202 maintains a fillet of adhesive between conductive sheets 160,170 to prevent electrical breakdown during use. In the preferred embodiment, each perforation 202 has a diameter small enough to assure that conductive sheets 160,170 will not contact each other through one of perforations 202 during the bonding process. For example, the diameter of each perforation 202 may be less than two or three times the thickness of dielectric sheet 150. Also in the preferred embodiment, perforations 202 are evenly spaced over and cover approximately one-half of the surface area of dielectric sheet 150.

If it is desired to provide separate power circuit paths on upper conductive layer 160 and/or lower conductive layer 170, then the copper foil of the appropriate layer(s) 160,170 is etched accordingly.

Once assembled, a desired number of pre-etched, foil-clad, FR-4 epoxy filled, pre-pregnated fiberglass panels may be laminated to one or both sides of the power distribution core 140 to complete the printed circuit board 100 construction. Printed circuit board lamination and etching techniques mentioned above are well-known in the art.

It should be understood that other circuit board construction techniques may be applied to the laminations attached to power distribution core 140. The resulting circuit board 100 will fall within the scope of the present invention.

In the embodiment described above, circuit board 100 includes a single power distribution core. It should be understood, however, that the invention may be used to construct a circuit board having a plurality of power distribution core elements. This would involve interleaving a plurality of dielectric layers 150 with a plurality of conductive layers 160, 170. The individual core elements may be used as separate power planes or may be electrically connected in parallel for a further increase in capacitance.

As discussed above, the insulating laminate most widely used in the manufacture of printed circuit boards is designated FR-4, which is a fire-retardant, epoxy-impregnated glass cloth composite. The typical epoxy resin used in FR-4 composite is the diglycidyl ether of 4,4'-bis(hydroxyphenyl) methane or low-molecular weight polymers thereof. This is referred to as a bisphenolA (BPA)-based system. Fire retardancy is imparted by including enough tetra-bromobisphenol-A with the BPA to provide 15% to 20% bromide content. The curing agent typically used for the epoxy resin is dicyandiamide (DICY). The catalyst or accelerator is usually a tertiary amine, such as tetramethyl butane diamine, 1,3 bis (dimethyl amino) butane (TMBDA).

A number of insulating polymers could be used as a substitute for the epoxy resin used in FR-4 composite. Examples include, but are not limited to, thermoplastics such as acetals and related copolymers; acrylics; cellulosics; fluoroplastics; ketone-based resins; nylons (polyamides); polyamide-imides; polyarylates; polybutylenes; polycarbonates; polyesters; polystyrenes; polyether sulfonates; polyphenylene oxides; polyphenylene sulfides; certain liquid crystal polymers; and mixtures and/or copolymers thereof. Other insulators which could be substituted for the FR-4 epoxy resin are thermosetting resin including, but not limited to, epoxy resins (other than FR-4); unsaturated polyester resins; vinyl resins; phenol resins; melamine resins; polyurethane resins; polyvinyl-butyryl resins; polyamide-imide resins; polyimide resins; silicone resins; and mixtures and/or copolymers thereof.

While the invention has been particularly shown and described with reference to several preferred embodiments thereof, it will be understood by those skilled in the art that various changes in form and details may be made therein without departing from the spirit and scope of the invention as defined in the appended claims.

What is claimed is:

1. A printed circuit board comprising:

a planar first outer layer;

a planar second outer layer; and a planar capacitive core disposed between said first and second outer layer, said capacitive core including
a first electrically conductive layer,
a second electrically conductive layer,
a perforated sheet of dielectric material disposed between said first and second electrically conductive layers, wherein said dielectric material is a ceramic, and
an adhesive filling perforations in said perforated sheet to bind said first electrically conductive layer to a first side of said perforated sheet and to bind said second electrically conductive layer to a second side of said perforated sheet.

2. The printed circuit board of claim 1, wherein said perforations account for approximately one half of the surface area of said perforated sheet.

3. The printed circuit board of claim 2, wherein each perforation has a diameter small enough to assure that said first and second electrically conductive sheets do not contact each other through said perforated sheet.

4. The printed circuit board of claim 3, wherein a thickness of said perforated sheet is equal to 0.003 inches and wherein each said perforation has a diameter not greater than twice said thickness of said perforated sheet.

5. The printed circuit board of claim 1, wherein said ceramic is lead zirconate titanate.

6. The printed circuit board of claim 5, wherein said first and second electrically conductive layers are copper foil.

7. A method for manufacturing an integrated decoupling capacitive core for a printed circuit board, the method comprising the steps of:

forming a dielectric material into a perforated sheet;

applying an adhesive to a surface of said perforated sheet;

squeegeeing said perforated sheet to force said adhesive into perforations in said perforated sheet and to remove excess adhesive from said surface of said perforated sheet;

sandwiching said perforated sheet between first and second electrically conductive layers to form the capacitive core;

applying pressure to the capacitive core to force any adhesive between said perforated sheet and said first electrically conductive layer and between said perforated sheet and said second electrically conductive layer to flow into said perforations in said perforated sheet; and curing said adhesive to bind the capacitive core together.

8. A capacitive power distribution core for a primed circuit board, comprising:

a first electrically conductive layer;

a second electrically conductive layer;

a perforated sheet of dielectric material disposed between said first and second electrically conductive layers, wherein said dielectric material is a ceramic; and an adhesive filling perforations in said perforated sheet to bind said first electrically conductive layer to a first side of said perforated sheet and to bind said second electrically conductive layer to a second side of said perforated sheet.

9. The capacitive power distribution core of claim 8, wherein said perforations account for approximately one half of the surface area of said perforated sheet.

10. The capacitive power distribution core of claim 9, wherein each perforation has a diameter small enough to assure that said first and second electrically conductive sheets do not contact each other through said perforated sheet.

11. The capacitive power distribution core of claim 10, wherein a thickness of said perforated sheet is equal to 0.003 inches and wherein each said perforation has a diameter not greater than twice said thickness of said perforated sheet.

12. The capacitive power distribution core of claim 8, wherein said ceramic is lead zirconate titanate.

13. The capacitive power distribution core of claim 12, wherein said first and second electrically conductive layers are copper foil.

* * * * *